US006931337B2

(12) United States Patent
Enichen et al.

(10) Patent No.: US 6,931,337 B2
(45) Date of Patent: Aug. 16, 2005

(54) LITHOGRAPHY TOOL IMAGE QUALITY EVALUATING AND CORRECTING

(75) Inventors: William A. Enichen, Poughkeepsie, NY (US); Christopher F. Robinson, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 10/604,051

(22) Filed: Jun. 24, 2003

(65) Prior Publication Data

US 2004/0267471 A1 Dec. 30, 2004

(51) Int. Cl.$^7$ ............................. G06F 19/00; G03F 9/00
(52) U.S. Cl. ..................... 702/85; 324/751; 382/151; 430/30; 702/81; 702/95; 702/155
(58) Field of Search ................................ 702/121, 155, 702/108, 95, 81, 85; 430/5, 30; 355/52; 382/144, 151; 324/751; 716/21

(56) References Cited

U.S. PATENT DOCUMENTS 6,344,750 B1 * 2/2002 Lo et al. ..................... 324/751
6,737,207 B2 * 5/2004 Imai ............................. 430/30
2003/0021466 A1 * 1/2003 Adel et al. .................. 382/151

* cited by examiner

Primary Examiner—Bryan Bui
Assistant Examiner—John Le
(74) Attorney, Agent, or Firm—Jay H. Anderson; Hoffman, Warnick & D'Alessandro LLC

(57) ABSTRACT

Electron beam lithography tool image quality evaluating and correcting including a test pattern with a repeated test pattern cell, an evaluation method and correction program product are disclosed. The test pattern cell includes a set of at least three elongated spaces with each elongated space having a different width than other elongated spaces in the set such that evaluation of a number of space widths in terms of tool image quality and calibration can be completed. The evaluation method implements the test pattern cell in a test pattern in at least thirteen sub-field test positions across an exposure field, which provides improved focus and astigmatism corrections for the lithography tool. The program product implements the use of corrections from the at least thirteen sub-field test positions to provide improved corrections for any selected sub-field position.

14 Claims, 5 Drawing Sheets

LITHOGRAPHY TOOL IMAGE QUALITY EVALUATING AND CORRECTING

BACKGROUND OF INVENTION

The present invention relates generally to lithography tools, and more particularly, to electron beam lithography tool image quality evaluating and correcting.

Image quality optimization on an electron beam lithography tool involves the adjustment of many electron optical parameters to correct for resolution limiting effects. Illustrative parameters include filament power, anode position, lens excitations, shape aperture rotation, shape deflection calibration, focus coil excitation, stigmator corrector excitations and beam exposure time. Contributing resolution detractors must be determined from the resultant exposed images. Resolution limiting effects may include, for example, illumination non-uniformity, shape aperture image rotation errors, shape aperture image size shape deflection miscalibration, spot defocus, spot astigmatism, focus variations and dose variations.

Conventional methodology to provide image quality optimization includes implementation of a test pattern, having a specialized test pattern cell, within an exposure field to highlight potential problems, and then determination of appropriate image quality corrections of the lithography tool to address the identified problems. The magnitude of some resolution detractors, such as spot shape errors, spot illumination non-uniformities and beam dose errors are typically independent of location in the exposure field. Accordingly, correction requires evaluation of exposed images for consistent errors across the field, and then applying uniform corrections. In contrast, other resolution limiting factors such as spot defocus and astigmatism lead to image quality variations across the exposure field. Corrections for these image quality problems have to be a function of position in the exposure field. The exposure field may be made up of thousands of sub-fields (e.g., a 2.16 mm×2.16 mm exposure field can be broken up into 90×90 array of 24 micron sub-fields). Typically, exposure of the test pattern includes exposure using an identical test pattern cell at nine (9) sub-field positions of an exposure field. Assuming a square exposure field, the test pattern cell may be used at the four corner sub-field positions, vertical and horizontal intermediate sub-field positions between the four corner sub-field positions, and a center sub-field position. Focus and astigmatism corrections for sub-field positions between these nine sub-field positions are provided by linear interpolation of correction data for the two nearest sub-field positions, which introduces inaccuracy in the corrections. For example, for a sub-field position half-way between a corner sub-field position and the center sub-field position, an averaging of the corrections for those respective sub-field positions would be used.

Additional problems relative to image quality optimization result from conventional test pattern cells. In particular, each test pattern cell is typically provided with one or two unique space widths, which necessitates numerous tests to address problems with a range of space widths. For example, an illustrative test pattern cell 10 is shown in FIG. 1. Test pattern cell 10 includes a plurality of elongated spaces 11 extending from a border 14, another plurality of elongated spaces 12 extending from border 14, an array of varied sized square spaces 16, and an X pattern cell 18 and a cross pattern cell 20 of the same width as elongated spaces 12. In terms of elongated spaces, only two different widths are provided. Use of such a limited number of unique elongated space widths in a test pattern cell presents problems because the choice of appropriate corrections to improve image quality may depend on the image fidelity over a range of space widths. For example, exposure dose calibration errors can result in space width errors that increase or decrease as a function of nominal feature width, or uniformly large or small features. In contrast, spot illumination problems typically cause reduced space widths for small features, but may cause no noticeable width decrease for relatively large features. Currently, the only way to compare corrections for a large range of different elongated space widths is by making multiple exposures of different test pattern cells. Separate test pattern cell exposures introduce new exposure and process variables, which complicate the correction analysis.

Another disadvantage of two width elongated space test pattern cells is that they do not allow evaluation of a lithography tool relative to beam shaping calibration. In particular, beam shaping is typically accomplished by applying a calibrated voltage to one or more electrically conductive plates adjacent to the electron beam of the lithography tool to electrostatically shift the beam over an aperture to shape (and size) the emitted beam. Where a test pattern cell provides only one or two elongated space widths, testing can only coarsely evaluate whether the lithography tool shaping deflection is accurately calibrated.

In view of the foregoing, there is a need in the art for improved methods of image quality evaluation and correction, and a test pattern cell that does not suffer from the problems of the related art.

SUMMARY OF INVENTION

The invention addresses electron beam lithography tool image quality evaluating and correcting and includes a test pattern with a repeated test pattern cell, an evaluation method and correction program product. The test pattern cell includes a set of at least three elongated spaces with each elongated space having a different width than other elongated spaces in the set such that evaluation of a number of space widths in terms of tool image quality and calibration can be completed. The evaluation method implements the test pattern cell in a test pattern in at least thirteen sub-field test positions across an exposure field, which provides improved focus and astigmatism corrections for the lithography tool. The program product implements the use of corrections from the at least thirteen sub-field test positions to provide improved corrections for any selected sub-field position.

A first aspect of the invention is directed to an electron beam lithography tool test pattern cell comprising: a first set of at least three elongated spaces, each elongated space having a different width than other elongated spaces in the first set.

A second aspect of the invention is directed to a method of evaluating image quality of an electron beam lithography tool, the method comprising the steps of: generating a test array of test pattern cell exposures at least thirteen sub-field test positions in an exposure field, wherein each test pattern cell exposure within a given test array occurs under a different set of lithography tool test corrections; and evaluating image quality based on the test arrays.

A third aspect of the invention is directed to a computer program product comprising a computer useable medium having computer readable program code embodied therein for correcting a lithography tool, the program product comprising: program code configured to determine a tool correction for a selected sub-field position within an exposure field based on recorded test corrections for at least thirteen sub-field test positions.

A fourth aspect of the invention is drawn to a computer-readable storage medium having stored therein instructions for performing a method, the method comprising the steps of: determining a lithography tool correction for a selected sub-field position within an exposure field of the lithography tool based on recorded test corrections for at least thirteen sub-field test positions including: implementing a two-dimensional, third-order polynomial equation for each recorded test correction; calculating a set of correction coefficients for each two-dimensional, third-order polynomial equation; and applying the set of correction coefficients to determine the lithography tool correction for the selected sub-field position.

A fifth aspect of the invention is directed to a system for optimizing lithography tool image quality, the system comprising: means for determining a tool correction for a selected sub-field position within an exposure field of a lithography tool based on recorded test corrections for at least thirteen sub-field test positions, the determining means including: means for implementing a two-dimensional, third-order polynomial equation for each recorded test correction; means for calculating a set of correction coefficients for each two-dimensional, third-order polynomial equation; and means for applying the set of correction coefficients to determine the tool correction for the selected sub-field position.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
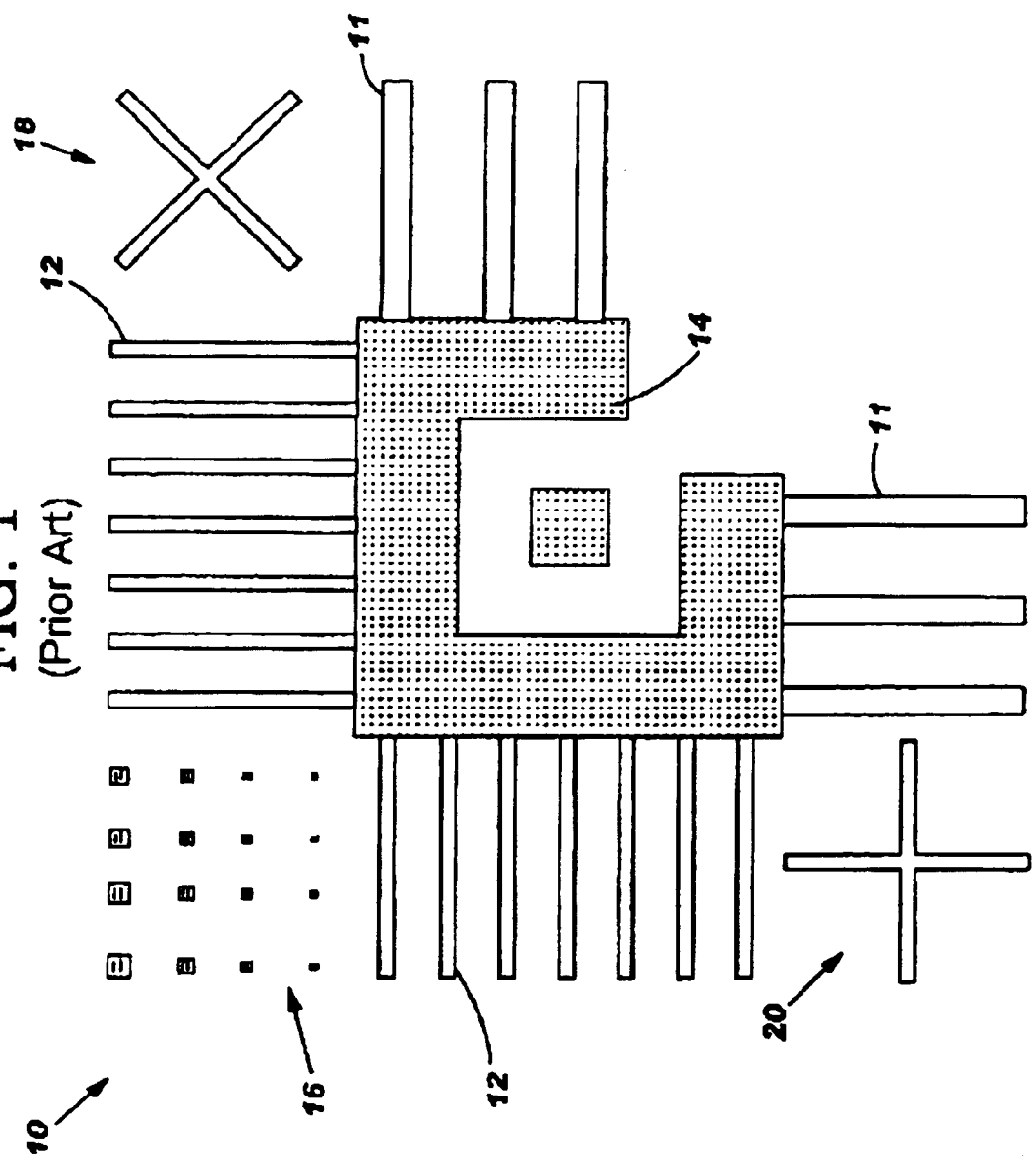
FIG. 1 shows a prior art test pattern cell including two sets of elongated spaces where each set has a unique width.
Figure 2:
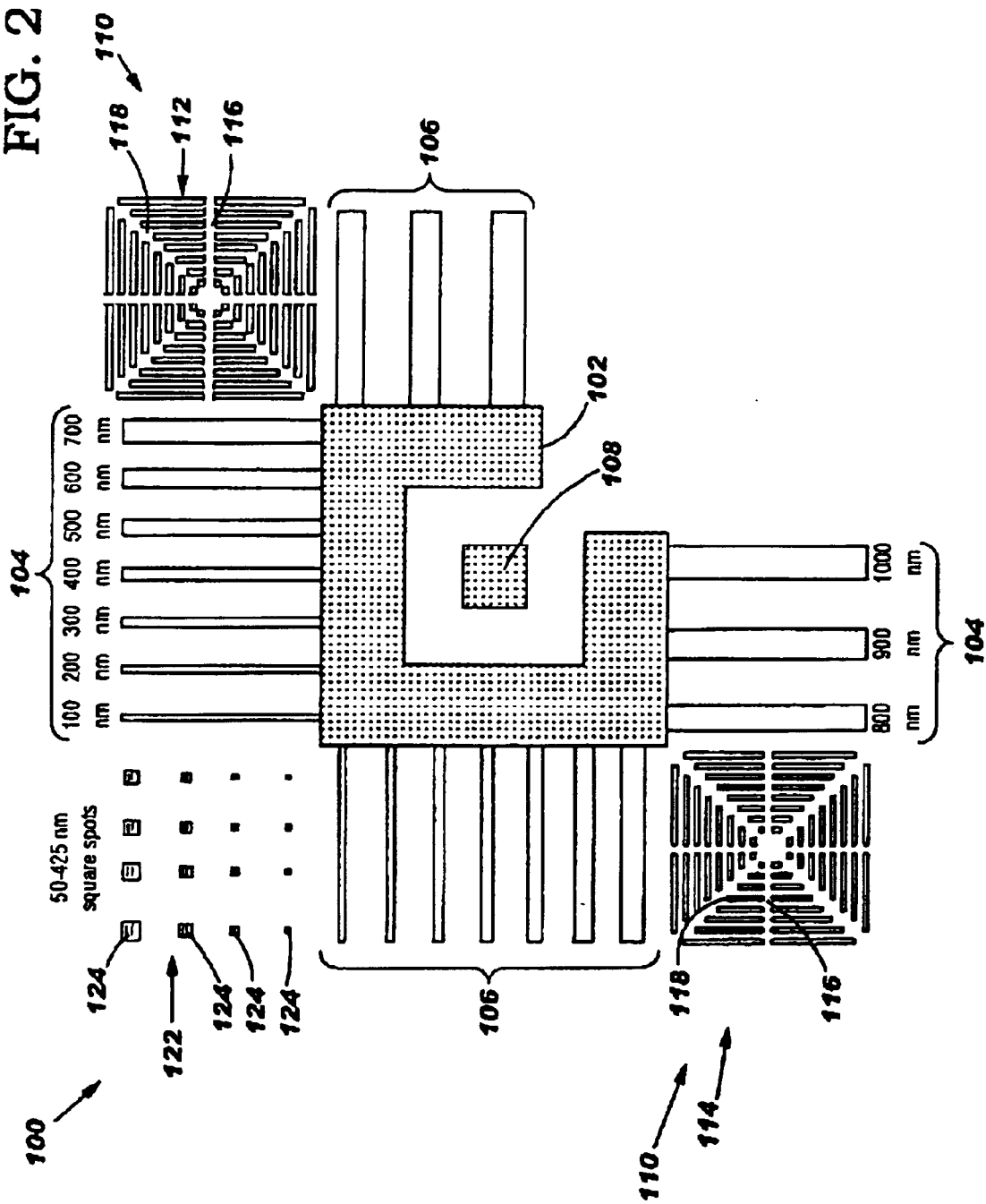
FIG. 2 shows a test pattern cell including a set of at least three elongated spaces, each elongated space having a different width than other elongated spaces in the set.

Referring to FIG. 2, a lithography tool test pattern cell 100 according to the invention is shown. Test pattern cell 100 includes a border 102 having a first set 104 of at least three elongated spaces with each elongated space having a different width than other elongated spaces in the first set. In one embodiment, the elongated space widths vary from a size that is below the nominal resolution limit of a lithography tool (not shown) to be tested to a size that is several times greater than the nominal resolution limit of the lithography tool. In the illustrative embodiment shown, the space widths range from 100 nm to 1000 nm with 100 nm increments. In particular, set 104 includes the following sizes extending from an upper side of border 102 as positioned: 100 nm, 200 nm, 300 nm, 400 nm, 500 nm, 600 nm, 700 nm; and the following sizes extending from a lower side of border 102 as positioned: 800 nm, 900 nm and 1000 nm. It should be recognized that the particular elongated space widths chosen and the number of spaces might be user selected based on, for example, the types of testing, the lithography tool resolution, etc. In terms of length, in one embodiment, each elongated space may be multiple "spots" of a particular lithography tool long. A "spot" is the fundamental, unaltered exposure area increment of an electron beam lithography tool. For example, each elongated space may be approximately three spots long, e.g., 6 μm for an electron beam lithography tool having a 2 μm×2 μm full size spot.

Test pattern cell 100 also may include a second set 106 of at least three elongated spaces with each elongated space having a different width than other elongated spaces in the second set. In the embodiment shown, second set 106 extends from left and right sides of border 102 as positioned, i.e., oriented orthogonally compared to first set 104. In one embodiment, the widths of first set 104 are substantially equivalent to the widths of second set 106 to aid in the analysis of imaging aberrations (e.g., astigmatism) that depend on exposed space orientation. Test pattern cell 100 may also include a square spot 108 of the maximum possible single exposure size (e.g., 2 μm square) surrounded by border 102.

To provide further testing capability, test pattern cell 100 includes at least one shape-in-shape pattern 110. A "shape-in-shape pattern" includes a series of shaped patterns (at least two), each positioned within a progressively larger version of substantially the same shape pattern. It should be recognized that other shaped patterns that nest regular arrays of horizontal and vertical features are also possible. In the embodiment shown, shape-in-shape patterns 110 are each box-in-box patterns 112, 114. The elongated spaces of each box-in-box pattern 112,114 may have different sizes. For example, a first box-in-box pattern 112 may include elongated spaces that are approximately 100 nm in width, and a second box-in-box pattern 114 may include elongated spaces that are approximately 75 nm in width. It should also be recognized that the patterns are not continuous. For example, box-in-box patterns 112,114 each include a cross blank pattern 116 and an X blank pattern 118, which make the shape-in-shape patterns more sensitive to resolution limiting aberrations. Test pattern cell 100 may also include an array 122 of varied sized square spaces 124.

By incorporating a range of elongated space widths in sets 104, 106 of multiple spot length and shape-in-shape patterns 110 with elongated space widths at or below the resolution limit of the lithography tool, certain image quality detractors may be more easily discerned. For example, exposure spot illumination non-uniformities are easier to distinguish from other problems when a range of elongated space widths from at or below the nominal resolution limit to a space width close to the maximum single exposure size are included. In another example, the provision of multiple spot length spaces (e.g., 3 times the full spot dimension) ensures sensitivity to spot edge imperfections. Spot edge imperfections may cause, for example, jagged spaces caused by shape aperture rotation errors, spaces with bulges or gaps caused by shape aperture image size errors, and/or horizontal and vertical space edges rotated in different directions caused by spot off-axis astigmatism. In another example, a range of elongated space widths also makes it possible to compare a range of critical dimension (CD) space measurements to look for shape deflection calibration errors. Further, a range of elongated space widths enables investigation of electron beam proximity effect dose corrections and the impact of Coulomb effect electron interactions that degrade spot focus as a function of exposed spot size (beam current). Further, shape-in-shape patterns 110 are particularly sensitive to small variations in spot focus or astigmatism. For example, practically any rotation of shaped spot edges due to off-axis astigmatism will be discernable by simply observing shape-in-shape patterns 110 rather than the conventional technique of attempting to discern spot edge rotation differences between multiple images exposed with different astigmatism corrections. Calibration of the electron beam lithography tool shaping deflection is also possible using test pattern cell 100 because the test pattern cell 100 includes the varied width elongated spaces achieved by changing the magnitude of the spot-shaping offset.

Figure 3:
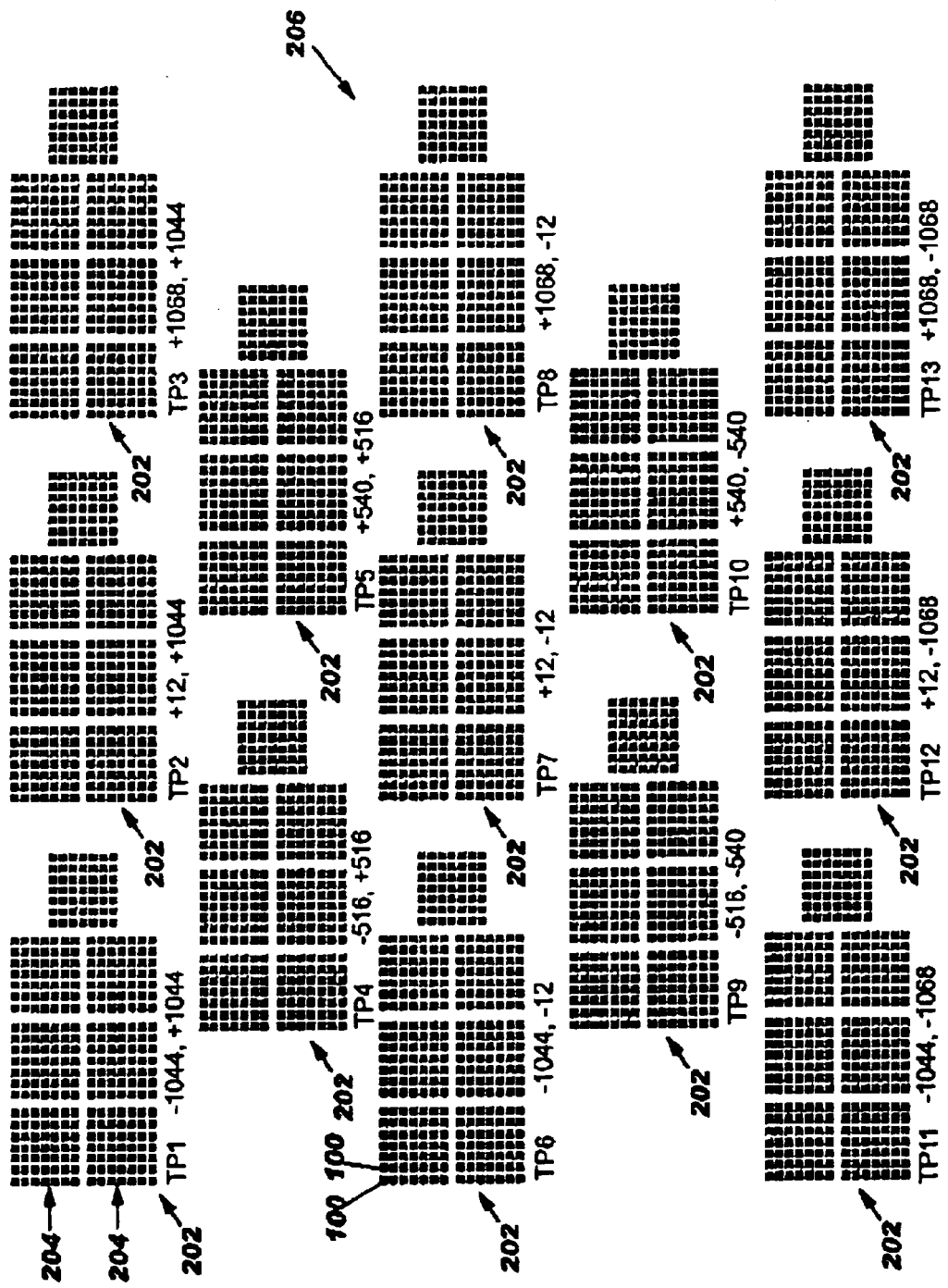
FIG. 3 shows a test array for at least thirteen sub-field test position generated by repeated exposures of the test pattern cell of FIG. 2.
Figure 4:
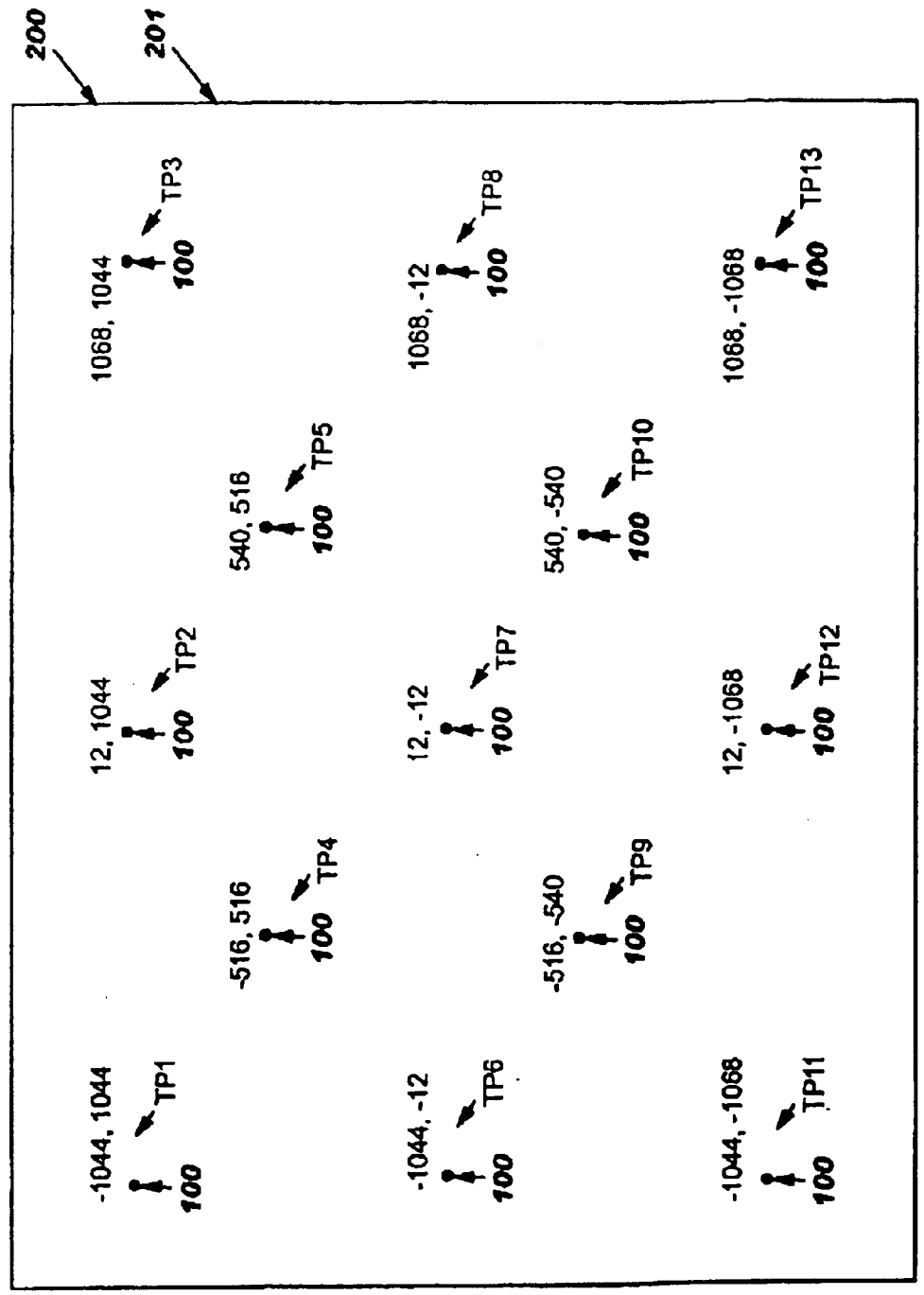
FIG. 4 shows a full-field test pattern including thirteen exposures of the test pattern cell of FIG. 2.
Figure 5:
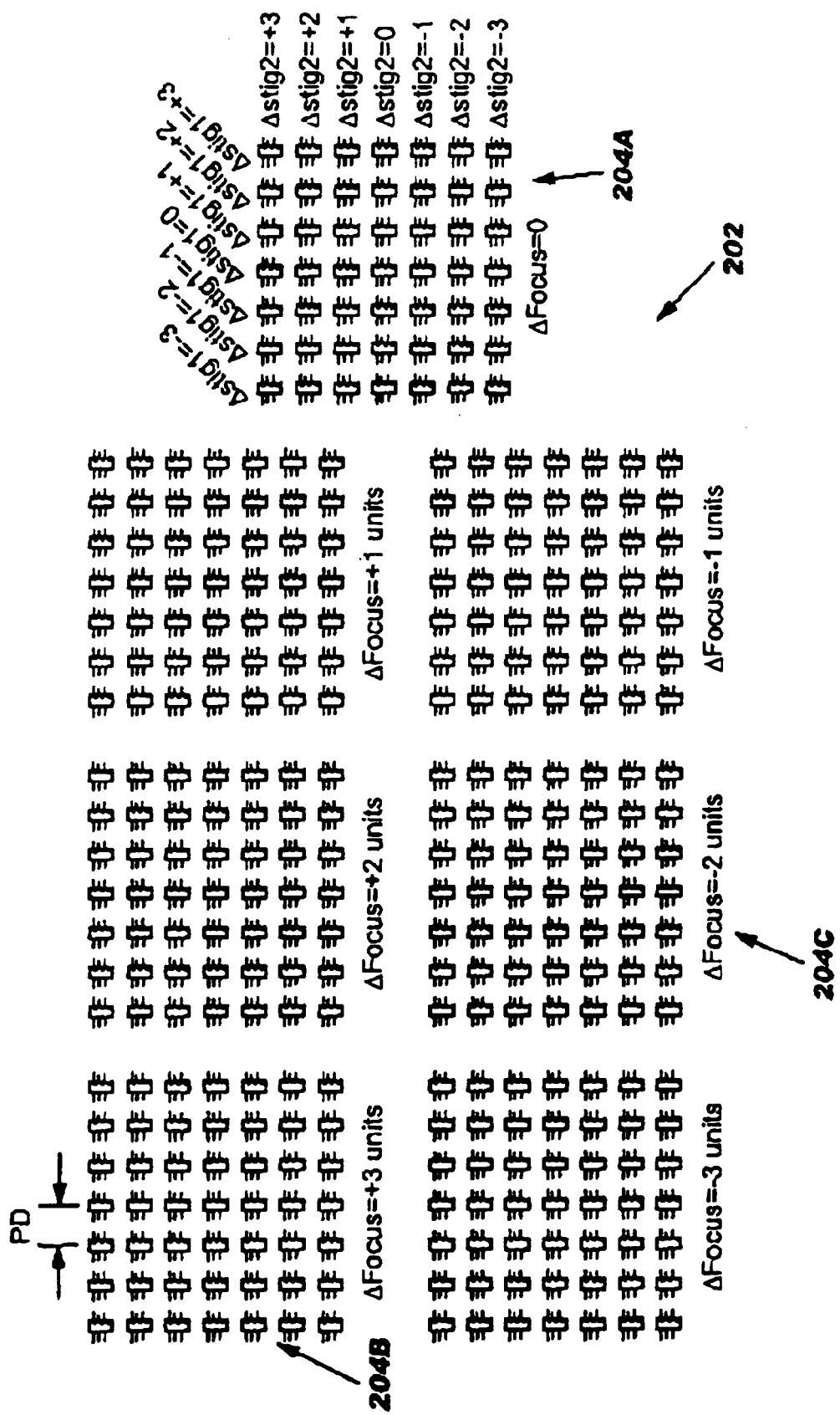
FIG. 5 shows a test array at one of the sub-field test positions shown in FIG. 3.

Turning to FIGS. 3–5, the invention includes a method of evaluating image quality of a lithography tool (not shown) using a test pattern including features such as test pattern cell 100. The method is applicable to field position dependent image quality errors, such as spot defocus and astigmatism. The following description will detail the method for use with test pattern cell 100. It should be recognized however that the method might be used with a variety of different test pattern cells. It should also be recognized that the method does not necessarily include every explicit step described below other than as defined in the appended claims.

In a first step of the method, a test array 202 (FIG. 3) of test pattern cell 100 exposures at at least thirteen sub-field test positions TP1–TP13 in an exposure field 201 (FIG. 4) is generated. Evaluation of similar images at multiple field positions enables correction of field position dependent image quality errors, such as spot defocus and astigmatism. An exposure field 201, as shown in FIG. 4, may be made up of thousands of sub-fields. As used herein, "sub-field test position" is a sub-field for which test pattern cell 100 exposure and evaluation has been completed, and "sub-field position" may be any sub-field of exposure field 201 (tested or un-tested). A group of the at least thirteen test arrays 202, shown in FIG. 3, constitute a composite test array 206.

Referring to FIG. 3, in one embodiment, the test array generating step includes repeatedly exposing test pattern cell 100 at each sub-field test position TP1–TP13 on a resist coated substrate. In one embodiment, each test pattern cell 100 exposure within a given test array 202 occurs under a different set of lithography tool test corrections. Further, each test pattern cell 100 exposure has a corresponding exposure in each test array that occurs under the same set of lithography tool test corrections. In other words, each test array 202 may be considered to include one test pattern cell 100 exposure of a test pattern 200 as shown in FIG. 4, and each test pattern 200 includes at least thirteen test pattern cell 100 exposures that all occur under a given set of lithography tool test corrections. Between each exposure, as shown in FIG. 3, the substrate is shifted a predetermined distance (PD) such that test pattern cell 100 exposures do not overlap, and a test array 202 is generated for each test position TP1–TP13 as illustrated by composite test array 206. "Shifting" the substrate may include movement of the lithography tool mechanical X, Y stage that holds the resist-coated substrate being exposed. In addition, shifting may include movement in a first direction or a second direction or both within a single plane. The "predetermined distance" (PD in FIG. 5) may be any distance such that successive exposures do not overlap. For a test pattern cell 100 that is, for example, 22 Î¼ m (FIG. 2) on both sides, a predetermined distance may be approximately 24 Î¼ m. In the embodiment shown in FIG. 3, each test array 202 includes seven 7×7 sub-arrays 204, which results in 343 exposures of test pattern cell 100 at each sub-field test position TP1–TP13.

Images of test pattern cell 100 (and composite test array 206 ) are formed by exposing at least a portion of a substrate (wafer or mask) coated with an electron beam sensitive resist to an electron beam (not shown), and developing the resist coated substrate to generate test array 202 at each sub-field test position, i.e., test array topographic features. The exposed substrate is treated with a developer that preferentially dissolves away irradiated resist in the case of a "positive" resist process or dissolves away the non-irradiated resist in the case of a "negative" resist process.

Generating a test array 202 of test pattern cell 100 exposures at at least thirteen sub-field test positions enables smooth tuning of the tool corrections (i.e., spot focus and two astigmatism corrections) as a function of position in exposure field 201, as will be described further below. The coordinates (e.g., −1044, 1044) shown in FIGS. 3 and 4 indicate the location of each sub-field test position in micrometers relative to the center (i.e., 0, 0) of exposure field 201 (FIG. 4).

Referring to FIG. 5, an illustrative test array 202 is shown. As noted above, each exposure within a given test array occurs under a different set of lithography tool test corrections. That is, a different set of the three lithography tool coil currents for focus correction, in-axis astigmatism ("stig 1") correction, and off-axis astigmatism ("stig 2") correction is used for each exposure. For example, referring to sub-array 204A of test array 202 in FIG. 5, stig 1 is varied by column and stig 2 is varied by row. Focus correction is varied by each sub-array 204 of 49 exposures. For example, sub-array 204A has a no focus correction, sub-array 204B has +3 units, and sub-array 204C has −2 units. "Units" may be any convenient measure for altering lithography tool settings, e.g., one or more mA for coil current. Although not noticeable to the naked eye, variations in image quality across the range of exposure conditions (i.e., lithography tool corrections) are readily observable when the exposed images are magnified by a factor of approximately 1000.

In a second step, image quality is evaluated based on test arrays 202 (FIGS. 3 and 5). In one embodiment, evaluation includes determining which exposure within each test array 202 at each sub-field test position TP1–TP13 provides a highest image quality, and recording at least one test correction (focus, stig 1, stig 2) for that exposure. In one embodiment, this step includes selecting, at each of the sub-field test positions, the best combination of focus correction, stig 1 correction stig 2 correction by evaluating the developed images with a high quality optical microscope or scanning electron microscope (SEM). When the evaluation is completed there is an optimal value for at least one of focus correction current, stig 1 correction current and stig 2 correction current for each sub-field test positions. It should be recognized that other forms of evaluation may also be carried out without departing from the scope of the invention.

In addition to the above evaluation, the method may also include correcting lithography tool image quality for any selected sub-field position (tested or untested) within the exposure field. In one embodiment, this step is achieved by determining and applying a tool correction(s), i.e., coil current(s), for any selected sub-field position within an exposure field based on the recorded test corrections for the sub-field test positions, e.g., the 13 positions TP1–TP13.

That is, at least one of a focus correction, a stig 1 correction, and a stig 2 correction may be determined for any selected sub-field position. As an alternative, a tool correction(s), i.e., coil current(s), for all sub-field positions within an exposure field may also be provided, and a mechanism for recalling this data may be implemented, i.e., a lookup table.

In order to determine/apply a tool correction for any selected sub-field position, an analytical representation of the sub-field test positions' corrections are required. It should be noted that while the following description is particular to implementation of 13 sub-field test positions, the invention is applicable with more (or less) sub-field test positions. In one embodiment, a two-dimensional, third-order polynomial is implemented for each recorded test correction, i.e., to model the test corrections. In this case, there is an equation for each test correction, i.e., focus, stig 1 and s 2, which applies at every sub-field position, including each sub-field test position. Illustrative two-dimensional, third-order polynomial equations for focus correction $I_F$, stig 1 correction $I_G$, and stig 2 correction $I_H$ are as follows:

$$I_F = a_{F9}X^3 + a_{F8}X^2Y + a_{F7}Y^2X + a_{F6}Y^3 + a_{F5}X^2 + a_{F4}XY + a_{F3}Y^2 + a_{F2}X + a_{F1}Y + a_{F0}. \quad (1)$$

$$I_G = a_{G9}X^3 + a_{G8}X^2Y + a_{G7}Y^2X + a_{G6}Y^3 + a_{G5}X^2 + a_{G4}XY + a_{G3}Y^2 + a_{G2}X + a_{G1}Y + a_{G0}. \quad (2)$$

$$I_H = a_{H9}X^3 + a_{H8}X^2Y + a_{H7}Y^2X + a_{H6}Y^3 + a_{H5}X^2 + a_{H4}XY + a_{H3}Y^2 + a_{H2}X + a_{H1}Y + a_{H0}. \quad (3)$$

Each correction's two-dimensional, third-order polynomial has a set of 10 polynomial correction coefficients ($a_0$ to $a_9$) that must be calculated, i.e., a to $a_{F9}$ for focus correction $I_F$, $a_{G0}$ to $a_{G9}$ for stig 1 correction $I_G$, and $a_{H0}$ to $a_{H9}$ for stig 2 correction $I_H$. The values of the 10 correction coefficients ($a_0$ $a_9$) define the third order polynomial fit for all sub-field positions for a given correction, and thus yield accurate corrections for even the untested sub-field positions. A convenient technique to handle simultaneous linear equations is to use a matrix representation as is given below:

$$\begin{vmatrix} I_1 \\ I_2 \\ I_3 \\ I_4 \\ I_5 \\ I_6 \\ I_7 \\ I_8 \\ I_9 \\ I_{10} \\ I_{11} \\ I_{12} \\ I_{13} \end{vmatrix} = \begin{vmatrix} X_1^3 & X_1^2Y_1 & X_1Y_1^2 & Y_1^3 & X_1^2 & X_1Y_1 & Y_1^2 & X_1 & Y_1 & 1 \\ X_2^3 & X_2^2Y_2 & X_2Y_2^2 & Y_2^3 & X_2^2 & X_2Y_2 & Y_2^2 & X_2 & Y_2 & 1 \\ X_3^3 & X_3^2Y_3 & X_3Y_3^2 & Y_3^3 & X_3^2 & X_3Y_3 & Y_3^2 & X_3 & Y_3 & 1 \\ X_4^3 & X_4^2Y_4 & X_4Y_4^2 & Y_4^3 & X_4^2 & X_4Y_4 & Y_4^2 & X_4 & Y_4 & 1 \\ X_5^3 & X_5^2Y_5 & X_5Y_5^2 & Y_5^3 & X_5^2 & X_5Y_5 & Y_5^2 & X_5 & Y_5 & 1 \\ X_6^3 & X_6^2Y_6 & X_6Y_6^2 & Y_6^3 & X_6^2 & X_6Y_6 & Y_6^2 & X_6 & Y_6 & 1 \\ X_7^3 & X_7^2Y_7 & X_7Y_7^2 & Y_7^3 & X_7^2 & X_7Y_7 & Y_7^2 & X_7 & Y_7 & 1 \\ X_8^3 & X_8^2Y_8 & X_8Y_8^2 & Y_8^3 & X_8^2 & X_8Y_8 & Y_8^2 & X_8 & Y_8 & 1 \\ X_9^3 & X_9^2Y_9 & X_9Y_9^2 & Y_9^3 & X_9^2 & X_9Y_9 & Y_9^2 & X_9 & Y_9 & 1 \\ X_{10}^3 & X_{10}^2Y_{10} & X_{10}Y_{10}^2 & Y_{10}^3 & X_{10}^2 & X_{10}Y_{10} & Y_{10}^2 & X_{10} & Y_{10} & 1 \\ X_{11}^3 & X_{11}^2Y_{11} & X_{11}Y_{11}^2 & Y_{11}^3 & X_{11}^2 & X_{11}Y_{11} & Y_{11}^2 & X_{11} & Y_{11} & 1 \\ X_{12}^3 & X_{12}^2Y_{12} & X_{12}Y_{12}^2 & Y_{12}^3 & X_{12}^2 & X_{12}Y_{12} & Y_{12}^2 & X_{12} & Y_{12} & 1 \\ X_{13}^3 & X_{13}^2Y_{13} & X_{13}Y_{13}^2 & Y_{13}^3 & X_{13}^2 & X_{13}Y_{13} & Y_{13}^2 & X_{13} & Y_{13} & 1 \end{vmatrix} \times \begin{vmatrix} a_9 \\ a_8 \\ a_7 \\ a_6 \\ a_5 \\ a_4 \\ a_3 \\ a_2 \\ a_1 \\ a_0 \end{vmatrix} \quad (4)$$

The currents ($I_1$ to $I_{13}$) are the optimized currents for a particular correction (i.e., coil) at each of the 13 sub-field test positions TP1–TP13. The X and Y values represent the sub-field test positions TP1–TP13 in microns. Correction coefficients ($a_0$ to $a_9$) for equations (1), (2) and (3) are determined from a system of linear equations as shown in matrix (4). This is an over-specified set of linear equations so a least squares fit solution is required. Solving matrix equations of this form can be done using a software package such as: MATLABÂ®, APLÂ®or some math subroutines for the "C" computer language.

After the correction coefficients ($a_0$ to $a_9$) for each test correction are calculated, they may be applied to determine a tool correction(s) for a selected sub-field position (or all sub-field positions) in the exposure field. In particular, the corresponding equations (1)–(3) may be solved for one or more of the focus correction, stig 1 correction, and stig 2 correction by inserting a selected sub-field position's X, Y coordinates in micrometers, the same units that were used to determine the polynomial coefficients. The result provides the tool correction for any selected sub-field position in the exposure field. It should be recognized that while the invention has been described relative to individual tool corrections, that a combination of corrections may be constructed such that a collective tool correction may be implemented.

Since there is a physical limit to the maximum correction coil current that can be applied, the resultant focus correction, stig 1 correction and stig 2 correction equations (1)–(3) must be verified not to specify higher currents than possible for any values of X and Y. Currents exceeding the sourcing capabilities of the electronic drivers are said to "saturate" the drivers. If saturation should occur, the coil output should be set to the allowable maximum value and an error message should be issued. If desired, the calculated focus correction, stig 1 correction and stig 2 corrections for each sub-field position in the exposure field may be placed in a lookup table. As the system steps from sub-field to sub-field within the exposure field, the values in the lookup table are loaded to the corresponding coil drivers for focus correction, stig 1 correction and stig 2 correction. Since a set of tool corrections for any X, Y sub-field position is based on a fit to all 13 sub-field test positions, smooth tuning of the tool corrections (spot focus and astigmatism corrections) across the exposure field is possible.

In the previous discussion, it will be understood that the method steps discussed are performed by a processor, such as CPU of a computer system, executing instructions of program product stored in memory. For example, the method steps may be performed by program code configured to determine a lithography tool correction for a sub-field position within an exposure field based on a least squares third order polynomial fit at thirteen sub-field test positions for which lithography tool corrections have been recorded. The program code may implement a two-dimensional, third-order polynomial equation for each correction (focus, stig 1, stig 2) as described above. It is understood that the various devices, modules, mechanisms and systems for executing this program product may be realized in hardware, software, or a combination of hardware and software, and may be compartmentalized in various ways. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of evaluating image quality of an electron beam lithography tool, the method comprising the steps of:
   generating a test array of test pattern cell exposures at a plurality of sub-field test positions in an exposure field, wherein each test pattern cell exposure within a given test array occurs under a different set of lithography tool test corrections;
   evaluating image quality based on the test arrays; and
   applying a tool correction for a selected sub-field position within the exposure field based on recorded test corrections for the sub-field test positions, including:
      implementing a two-dimensional, third-order polynomial equation for each recorded test correction;
      calculating a set of correction coefficients for each two-dimensional, third-order polynomial equation; and
      applying the set of correction coefficients to determine the tool correction for the selected sub-field position.

2. The method of claim 1, wherein each test pattern cell exposure has a corresponding exposure in each test array that occurs under the same set of lithography tool test corrections.

3. The method of claim 1, wherein the generating step includes:
   repeatedly exposing the test pattern cell at each sub-field test position on a resist coated substrate,
   shifting the resist coated substrate a predetermined distance between each exposure to generate the test array at each sub-field test position, and
   developing the resist coated substrate to generate the test array at each sub-field test position.

4. The method of claim 3, wherein the step of shifting includes shifting in both a first direction and a second direction within a single plane.

5. The method of claim 1, wherein the evaluating step includes:
   determining which exposure within each test array provides a highest image quality and recording a test correction for that exposure for each sub-field test position.

6. The method of claim 1, wherein the evaluating step is conducted for at least one of a focus correction, an in-axis astigmatism correction, and an off-axis astigmatism correction.

7. The method of claim 1, wherein the test pattern cell includes:
   a set of at least three elongated spaces, each elongated space having a different width than other elongated spaces in the set; and
   at least one box-in-box pattern.

8. The method of claim 1, wherein the plurality of sub-field test positions includes at-least thirteen sub-field test positions.

9. A computer-readable storage medium having stored therein instructions for performing a method, the method comprising the steps of:
   determining a lithography tool correction for a selected sub-field position within an exposure field of the lithography tool based on recorded test corrections for a plurality of sub-field test positions including:
      implementing a two-dimensional, third-order polynomial equation for each recorded test correction;
      calculating a set of correction coefficients for each two-dimensional, third-order polynomial equation; and
      applying the set of correction coefficients to determine the lithography tool correction for the selected sub-field position.

10. The storage medium of claim 9, wherein the plurality of sub-field test positions includes at least thirteen sub-field test positions.

11. A system for optimizing lithography tool image quality, the system comprising:
   means for determining a tool correction for a selected sub-field position within an exposure field of a lithography tool based on recorded test corrections for a plurality of sub-field test positions, the determining means including:
      means for implementing a two-dimensional, third-order polynomial equation for each recorded test correction;
      means for calculating a set of correction coefficients for each two-dimensional, third-order polynomial equation; and
      means for applying the set of correction coefficients to determine the tool correction for the selected sub-field position.

12. The system of claim 11, wherein the plurality of sub-field test positions includes at least thirteen sub-field test positions.

13. The system of claim 11, wherein the determining means further includes:
   means for determining which exposure within each test array provides a highest image quality and recording a test correction for that exposure for each sub-field test position.

14. The system of claim 11, wherein the test pattern cell includes:
   a set of at least three elongated spaces, each elongated space having a different width than other elongated spaces in the set; and
   at least one box-in-box pattern.

* * * * *